(12) United States Patent
Benson

(10) Patent No.: US 11,601,097 B2
(45) Date of Patent: Mar. 7, 2023

(54) DEVICES AND METHODS FOR AUTOMATIC THERMAL BIAS OF TRANSISTORS IN MUSICAL DEVICES

(71) Applicant: BENSON AMPS, INC., Oregon City, OR (US)

(72) Inventor: Christopher Benson, Oregon City, OR (US)

(73) Assignee: Benson Amps, Inc., Oregon City, OR (US)

( * ) Notice: Subject to any disclaimer, the term of this patent is extended or adjusted under 35 U.S.C. 154(b) by 0 days.

(21) Appl. No.: 17/475,765

(22) Filed: Sep. 15, 2021

(65) Prior Publication Data

US 2022/0085768 A1 Mar. 17, 2022

Related U.S. Application Data

(60) Provisional application No. 63/079,865, filed on Sep. 17, 2020.

(51) Int. Cl.
*H03F 1/30* (2006.01)
*G01R 19/165* (2006.01)

(52) U.S. Cl.
CPC ....... *H03F 1/302* (2013.01); *G01R 19/16557* (2013.01); *H03F 2200/03* (2013.01); *H03F 2200/447* (2013.01); *H03F 2200/468* (2013.01)

(58) Field of Classification Search
CPC ............. H03F 1/302; H03F 2200/03; H03F 2200/447; H03F 2200/468; H03F 1/0272; H03F 3/21; G01R 19/16557; G01R 19/16576
USPC ....................................... 330/289, 277, 296
See application file for complete search history.

(56) References Cited

U.S. PATENT DOCUMENTS

| | | | |
|---|---|---|---|
| 4,302,727 A * | 11/1981 | Iwamatsu | H03F 1/307 330/289 |
| 9,035,701 B2 * | 5/2015 | Schooley | H03F 3/21 330/296 |
| 9,378,777 B2 * | 6/2016 | Koyama | H01L 29/7869 |

* cited by examiner

*Primary Examiner* — Hieu P Nguyen
(74) *Attorney, Agent, or Firm* — Dentons Durham Jones Pinegar; Sarah W. Matthews

(57) ABSTRACT

A circuit system for providing thermal stability to a transistor may include: a comparing circuit in electrical communication with the transistor for receiving a present voltage from the transistor and comparing a present voltage to a predetermined bias voltage; a logic gate electronically coupled to an output of the comparing circuit, the logic gate, gate having a high, open position and a low, closed position; and a heating element thermally coupled to the transistor and electrically coupled to the output of the comparing circuit, wherein when the present voltage is lower than the predetermined bias voltage, the gate is in the high, open position providing current to the heating element, and wherein when the present voltage is higher than the predetermine bias voltage the gate is in the low, closed position.

20 Claims, 6 Drawing Sheets

*Figure 1: Prior art*

*Figure 2: Prior art*

DEVICES AND METHODS FOR AUTOMATIC THERMAL BIAS OF TRANSISTORS IN MUSICAL DEVICES

CROSS-REFERENCE TO RELATED APPLICATION

A claim for priority to the Sep. 17, 2020 filing date of U.S. Provisional Patent Application No. 63/079,865, titled AUTOMATIC THERMAL BIAS OF GERMANIUM TRANSISTORS IN MUSICAL DEVICES ("the '865 Provisional Application"), is hereby made pursuant to 35 U.S.C. § 119(e). The entire disclosure of the '865 Provisional Application is hereby incorporated herein.

TECHNICAL FIELD

The disclosure relates to modifications of amplifiers to reduce influence of variations of temperature or supply voltage or other physical parameters in transistors. More specifically, the disclosure describes devices and methods for achieving consistent character of sound in bipolar transistor amplifiers, and particularly germanium bipolar junction transistors used in musical electronics devices that use carefully chosen bias point and amplification factors, both of which vary according to temperature in germanium devices.

BACKGROUND

In the musical instruments industry it is well known that germanium transistors have a pleasing sound. For example, the vast majority of guitarists agree that the best sounding "fuzz boxes," or effects that create electronic musical distortion, use germanium transistors to generate a unique tone. Unfortunately, germanium transistors also possess qualities that make their use difficult and inconvenient. The transistors must be set at an ideal direct current (DC) bias to achieve optimal sound, but this DC bias shifts when the temperature of the transistor changes. For example, the voltage drop between the base and emitter elements of a transistor decreases with a rise in temperature, that is, the change in the base-to-emitter junction voltage necessary to sustain a given emitter current is a nearly linear function of temperature.

A related problem is that the gain factor, or hFE, of the transistor can change significantly with temperature fluctuation. In a germanium-based device, such shifts in bias and gain lead to inconsistent and unreliable sound ranging from a subtle unwanted shift in tone resulting in the device not functioning at all and becoming temporarily useless.

Musicians and recording engineers play and record music in a wide variety of environments, ranging from sunny festivals on hot stages, to winter gatherings in frozen conditions. Since germanium devices do not sound consistent, musicians often opt to use silicone based devices with far less sensitivity to temperature, even though the sound of a germanium-based device may be preferable.

The problem of inconsistent operation in germanium transistor-based musical devices has a long history of imperfect solutions. Each are described below: manual thermal bias, manual electronic bias, and automatic electronic bias (not to be confused with automatic thermal bias). These approaches are detailed below in order to display the new innovation of automatic thermal bias.

Manual Thermal Bias. The most basic strategy for manipulating the temperature, and therefore the bias voltage and hFE of in-circuit germanium devices is physically cooling, or heating the entire device before use. It has been well documented that germanium fuzz effect devices have often been cooled in a freezer before a performance in order to achieve a more desirable sound, since, either by flawed design or by choice, they are biased and gain staged more optimally when cold. One disadvantage of this solution is the device can only remain cold for so long out on a stage, and the sound changes when it returns to ambient temperature. Another disadvantage is the chance that a freezer would be unavailable, or a logistical mistake could prevent the prefreezing treatment, and lead to a ruined or distracted performance. This brute force strategy may be called "Manual Thermal Bias."

Manual Electronic Bias. Another strategy, as utilized in many germanium transistor designs, is to include a variable bias control knob on the exterior of the unit, so a musician can adjust the bias manually according as needed. This strategy most often takes a common emitter gain stage, and substitutes a fixed collector resistor for a variable resistive trimmer, which can then be adjusted for the desired bias (FIG. 1).

The problem with the manual electronic bias approach is twofold. First, while adjusting the bias by this method can achieve the desired point of bias, it cannot change the gain factor of the transistor, which still depends on temperature. Secondly, if the temperature shifts during the performance (which often happens when stage lights are on) the optimal bias is lost. Thus there is no automatic compensation for the shift in temperature with this manual approach.

Automatic Electronic Bias. The third solution is more refined than the previous two: the variable resistive trimmer on the germanium transistor's collector is made variable, and is automatically adjusted by a connected circuit to achieve the proper DC bias voltage. This automatic bias method uses large resistance and capacitance in an RC filter, in order to remove the AC component from the sensed DC bias. This DC bias is then compared to an ideal reference voltage using a comparator circuit. The comparator controls a Light Dependent Resistor (LDR) with an attached LED (commonly known as a Vactrol) which sets the bias point of the germanium transistor by varying the LDR. The Automatic Electronic Bias circuit has the advantage of automatically and instantaneously setting and maintaining the proper bias of the transistor stage, but like Manual Electronic Bias cannot manipulate the gain factor of the transistor, which is always increasing and decreasing with temperature. The topology of Automatic Electronic Bias is presented in FIG. 2.

SUMMARY

According to one aspect, a circuit system for providing thermal stability to a transistor may include: a comparing circuit in electrical communication with the transistor for receiving a present voltage from the transistor and comparing a present voltage to a predetermined bias voltage; a logic gate electronically coupled to an output of the comparing circuit, the logic gate, gate having a high, open position and a low, closed position; and a heating element thermally coupled to the transistor and electrically coupled to the output of the comparing circuit, wherein when the present voltage is lower than the predetermined bias voltage, the gate is in the high, open position providing current to the heating element, and wherein when the present voltage is higher than the predetermine bias voltage the gate is in the low, closed position. In some configurations, the logic gate has a middle position between the high, open position and the low, closed position.

In some configurations, the comparing circuit comprises a micro controller. In other configurations, the comparing circuit comprises a comparator operational amplifier circuit.

According to another aspect, the circuit system may include a filter electrically connected to the transistor prior to the comparing circuit, the filter for filtering AC current received from the transistor, in some configurations, the filter may comprise a resistor-capacitor network, and the comparing circuit receives a present DC voltage from the resistor-capacitor network and compares the present DC voltage to a desired bias voltage. Other low-pass filters may also be used. The filter may be electrically connected to a collector of the transistor.

According to another aspect, the logic gate may comprise a power transistor having a gate, the gate electronically coupled to an output of the comparator operational amplifier circuit. The logic gate may comprise a microcontroller in other configurations.

According to another aspect, a cooling element may be thermally coupled to the transistor and electrically coupled to the output of the comparing circuit. In some configurations the heating element comprises a resistor. A heating and/or cooling element may be provided.

According to yet another aspect, a variable resistor may be electrically coupled to an emitter of the transistor. The variable resistor may be set such that the circuit for providing thermal stability does not operate above a threshold temperature.

According to yet another aspect, a method of controlling a bipolar junction transistor may comprise the steps of: electrically coupling a collector of the bipolar junction transistor to a high impedance circuit, the high impedance circuit comprising: a filter for filtering AC current received from the collector of the bipolar junction transistor and outputting a present DC current; a comparing circuit for receiving the present DC current and determining a present DC voltage, the comparing circuit further comparing the present DC voltage to a predetermined optimal DC voltage; a logic gate coupled to an output of the comparing circuit, the logic gate having an open position and a closed position; and a logic gate electronically coupled to an output of the comparing circuit, the logic gate, gate having a first position and a second position; and a heating element electrically coupled to the output of the comparing circuit, wherein when the present DC voltage is lower than the predetermined optimal DC voltage, the logic gate is in a first position to turn the heating element on, and wherein when the present voltage is higher than the predetermined optimal DC voltage, the logic gate is in the second position to turn the heating element off; and wherein the method further comprises the step of thermally coupling the heating element to the bipolar junction transistor.

According to another aspect, the step of thermally coupling the heating element to the bipolar junction transistor may comprise attaching the heating element to the bipolar junction transistor. The step may also include placing thermal grease between the heating element and the bipolar junction transistor.

The method may also include the step of electrically connecting a variable resistor to an emitter of the bipolar junction transistor, and/or adjusting the variable resistor such that current does not flow through the high impedance circuit above a predetermined threshold temperature.

According to another aspect, a system is described for providing thermal stability to a germanium transistor. The system may include: a high impedance circuit coupled to a collector of the transistor for receiving an input signal; a resistor-capacitor network in electrical communication with the high impedance circuit for filtering an AC component from the input signal; a comparator operational amplifier circuit in electrical communication with the resistor-capacitor network for receiving a present DC bias from the resistor-capacitor network and comparing the present DC bias voltage to a desired bias voltage; a voltage divider electronically coupled to the comparator operational amplifier circuit, the voltage divider between supply voltage and ground for selecting the desired bias voltage; a power transistor having a gate, the gate electronically DC-coupled to an output of the comparator operational amplifier circuit, the gate having a high, open position and a low, closed position; and one or more heating elements thermally coupled to the germanium transistor and electrically coupled to the output of the comparator operational amplifier circuit, wherein when the present DC bias voltage is lower than the desired bias voltage, the gate is in the high, open position providing current to the one or more resistors, and wherein when the present DC bias voltage is higher than the designed bias voltage the gate is in the low, closed position.

According to another aspect, the system may include a cooling element thermally coupled to the germanium transistor. In some configurations, a heating element may be included or a cooling element. In other configurations, a heating element and a cooling element may be provided.

According to yet another aspect, a device may include: at least one of a heating source and a cooling source for thermal contact with a germanium transistor; at least one of an analog circuit and a digital circuit for controlling the at least one of a heating source and a cooling source; a voltage divider for selecting an ideal bias voltage; and the at least one of the analog and digital circuit comparing a present bias voltage to the ideal bias voltage, and controlling the at least one of a heating source and a cooling source in response to a difference between the present bias voltage and the ideal bias voltage.

BRIEF DESCRIPTION OF DRAWINGS

The following drawings illustrate what are currently considered to be specific representative configurations for carrying out the invention and are not limiting as to embodiments which may be made in accordance with the present invention. The components in the drawings are not necessarily to scale relative to each other. Like reference numerals designate corresponding parts throughout the several views.

The drawings are illustrative and not limiting of the scope of the invention which is defined by the appended claims. The various elements of the invention accomplish various aspects and objects of the invention. Not every element of the invention can be clearly displayed in a single drawing, and as such not every drawing shows each element of the invention. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
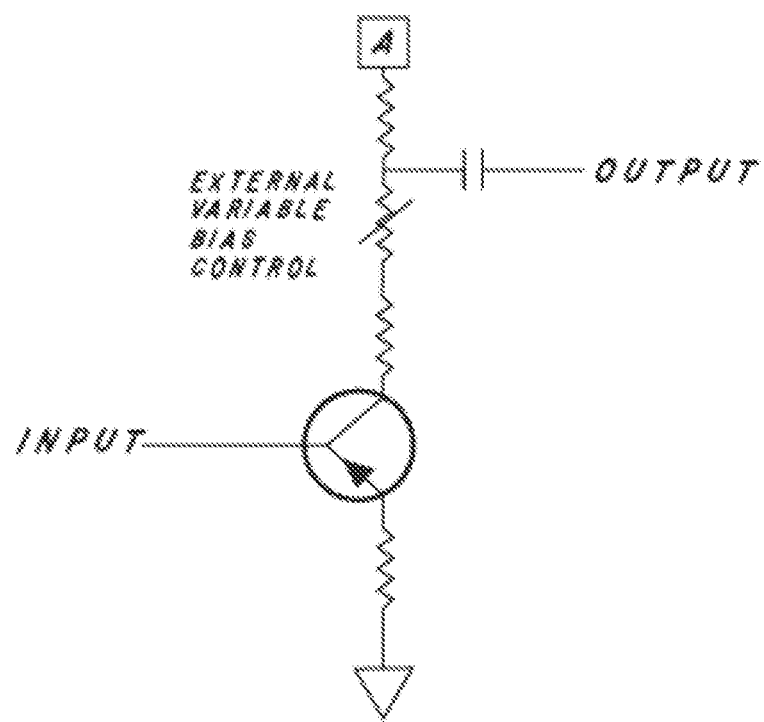
FIG. 1 shows a circuit diagram of a prior art method of manual electronic bias.
Figure 2:
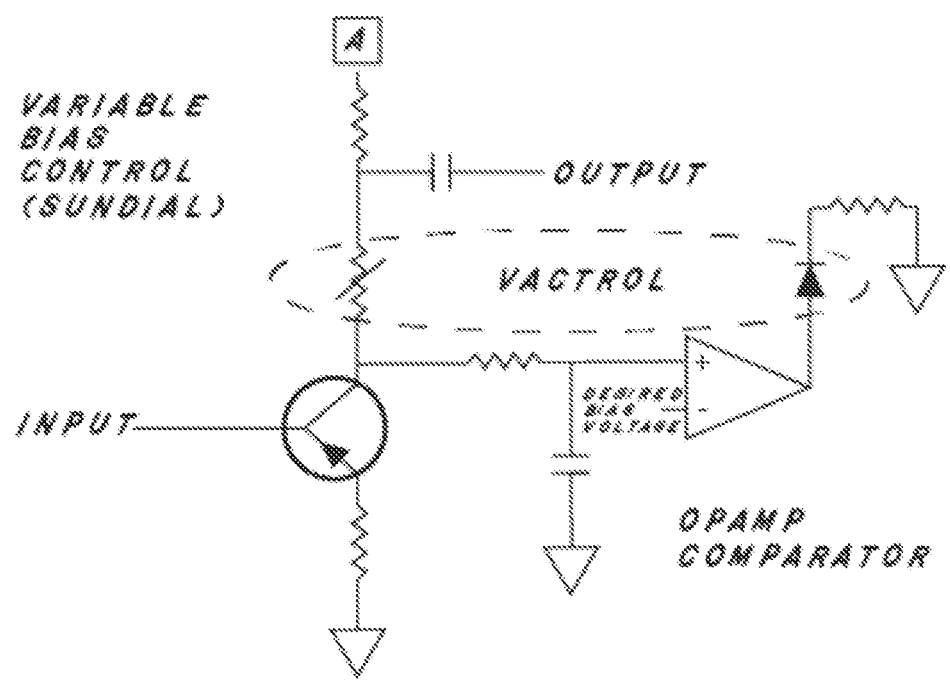
FIG. 2 shows a circuit diagram of a prior art method of automatic electronic bias.
Figure 3:
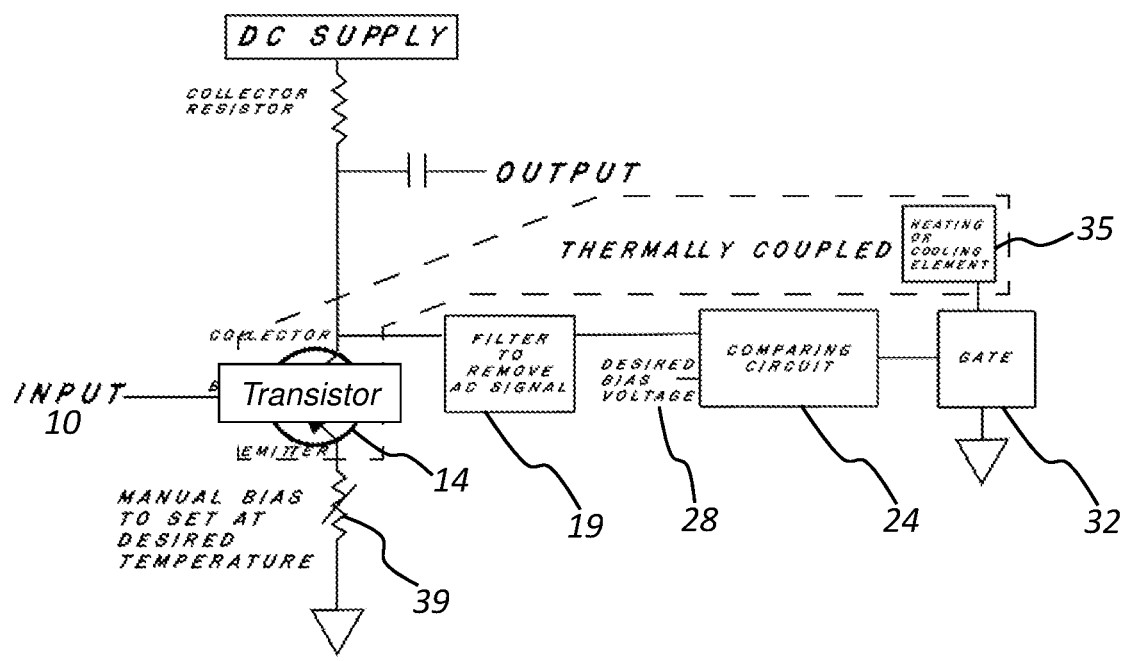
FIG. 3 shows a block circuit diagram of an embodiment of an automatic thermal bias that may be used with a transistor.
Figure 4:
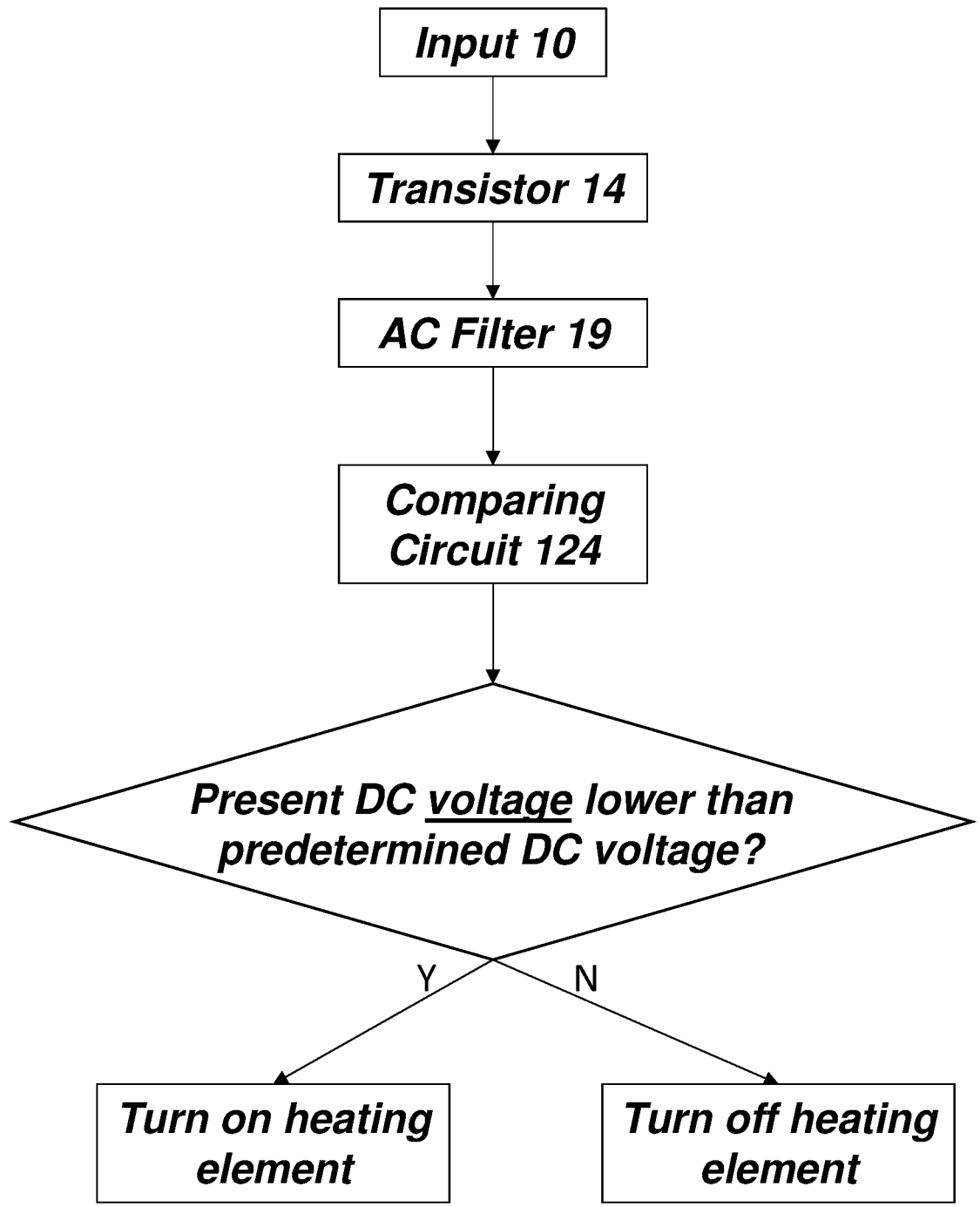
FIG. 4 shows a method of the automatic thermal bias that is set forth in FIG. 3.

The present disclosure seeks to solve the problem of temperature variability in germanium transistors in musical hardware devices by automatically controlling the physical temperature of the germanium device using, but not limited to, the following methods. As used herein, "transistor," "germanium transistor," "bipolar-junction-transistor," and "BJT" may be used interchangeably and may all refer to a transistor that may benefit from thermal control. Any type of transistor may be used and is contemplated, for example, germanium transistors, silicon transistors, etc. S With reference to FIG. 3, an embodiment of a circuit for automatic thermal bias that may be used with a transistor 14, is depicted. FIG. 4 shows a flow chart of the method of automatic thermal bias taken by the circuit of FIG. 3. This exemplary method uses a circuit that is coupled to the collector of the transistor 14 requiring thermal control. While a common base bipolar junction transistor 14 (BJT) amplifier topology is shown, other types of topologies may also be used, such as a common-emitter topology and/or a common base topology, and any suitable coupling is contemplated herein. Similarly, the transistor 14 may be a BJT or any other type of transistor, and may be NPN transistor or a PNP transistor. The transistor 14 may be coupled using a high impedance circuit (in this exemplary configuration a directly coupled silicone BJT transistor acting as an emitter follower, but other methods may be used for coupling) so as not to interfere with the musical information coming off of the same node.

After the input 10 is passed through the transistor 14, one or more filters 19 may be provided to remove and/or reduce the AC signal. In other configurations, a filter 19 may not be provided. In one exemplary configuration, the AC signal may be extracted by filtering the AC component of the signal out. For example, this may be done using a resistor-capacitor (RC) network or any other suitable low-pass filter. Other known methods of extracting the AC signal may also be used. This same network may be used to avoid hysteresis and oscillation in the following circuit.

The resulting DC current after the filter 19 may then be fed into one side of a comparing circuit 24. Any type of suitable comparing circuit may be used. For example, a comparator operational amplifier (op-amp) circuit may be used. In other configurations, the DC current may be fed into a microcontroller, or any other circuitry capable of comparing two voltages. In configurations where an op-amp is used as the comparing circuit 24, the op-amp may have two inputs: one as the present DC voltage, and the other side of the op-amp circuit may be permanently or variably set using a voltage divider between supply voltage and ground. This predetermined voltage is labelled "desired bias voltage" 28 in FIG. 3, and is also referred to as "predetermined voltage" in FIG. 4. The comparing circuit 24 may compare the present DC voltage input from the transistor 14 to the desired bias voltage or predetermined voltage that may be permanently or variably set. Depending on the comparison, the comparing circuit 24 may have different outputs, as explained in more detail below.

The output of the comparing circuit 24 may be coupled to a logic gate 32. Any suitable logic gate 32 may be used and many are known in the art. For example, a BJT, a relay, a MOSFET, a JFET, transistors, diodes, inverters, and any combinations of the foregoing may be used as suitable gates. In one exemplary configuration, the output of the comparing circuit 24 may be DC-coupled to the gate of a power transistor. When the present DC voltage is lower than the "desired bias voltage" or predetermined voltage as set at the comparing circuit 24, the output of the comparing circuit 24 brings the gate 32 high, or in other words, turns on the gate and allows current to flow. The current may flow through to one or more heating and/or cooling elements 35. Similarly, when the present DC voltage is higher than the "desired bias voltage" or predetermined voltage, the output of the comparing circuit 24 brings the gate 32 low to stop current from flowing through the connected heating and/or cooling elements 35. In other configurations, there may be positions for the gate other than high or low, that is, positions that are between high and low to allow partial current, or less than the full current, to flow.

The heating and/or cooling element(s) 35 may be thermally coupled to the transistor 14. Any suitable heating and/or cooling element(s) 35 may be used. In some embodiments, a resistor may be used as a heating element. The heating and/or cooling element(s) 35 may be thermally coupled to the transistor 14 in any suitable manner. For example, in some configurations, one or more resistor(s) may be thermally coupled to the metal enclosure of the germanium transistor. For example, the thermal coupling may be achieved by placing the BJT in direct contact with a heating and/or cooling element, and thermal grease may be used to improve heat transfer. In other configurations, the heating/cooling resistor(s) may be thermally coupled directly to the germanium transistor. When the present DC voltage is low, the control circuit may turn a heating element or other heating circuit on. The transistor 14 may be thus heated until the desired bias voltage is reached. When that point is sensed, the heating circuit may be turned off, and the transistor 14 may be allowed to cool, until it falls under the optimum bias and the heating circuit may be turned back on. In other configurations, a cooling element may be provided to actively cool the transistor in a manner similar to the active heating of the transistor.

In some configurations, an additional static bias control can be used. For example, a variable resistor 39 (such as a resistive trimmer or other suitable means) may be coupled to the emitter of the transistor 14. This resistor 39 may technically a bias control, but since the bias is set automatically elsewhere, this resistor 39 may indirectly set a temperature threshold control and may be used to set the switching temperature at which the heating element may engage. The goal of the resistor 39 may be to strike a balance between overheating and destroying the transistor 14, while at the same time avoiding too low a switching temperature to be effective in common use. The circuit typically needs to be set at a temperature that is hotter than the effect would ever reasonably be used at, but cooler than a temperature that would destroy the transistor, which has an upper limit of what temperature it can endure. This predetermined threshold temperature may vary and may be set either by the manufacturer or the end user.

For example, the data sheet for the 2N527 PNP germanium BJT transistor lists its storage and operating temperature as −65° to +100° C., so 100° C. is the upper limit. A reasonably hot stage would never approach the boiling point of water so the user can choose a much lower switching temperature, for instance 37.7° C., or 100° Fahrenheit, approximately the temperature of a sunny day on stage. It this example where the variable resistor is set to operate at 37.7° C., or 100° Fahrenheit, for any temperature lower than 100° F. that the circuit is operated in, the control circuit would intermittently turn on to attempt to maintain the temperature of the transistor at or around 100° F., and would operate with the desired and consistent DC bias and gain factor. For any temperature above 100° F., the control circuit would not operate to ensure it does not further heat the transistor.

Figure 5:
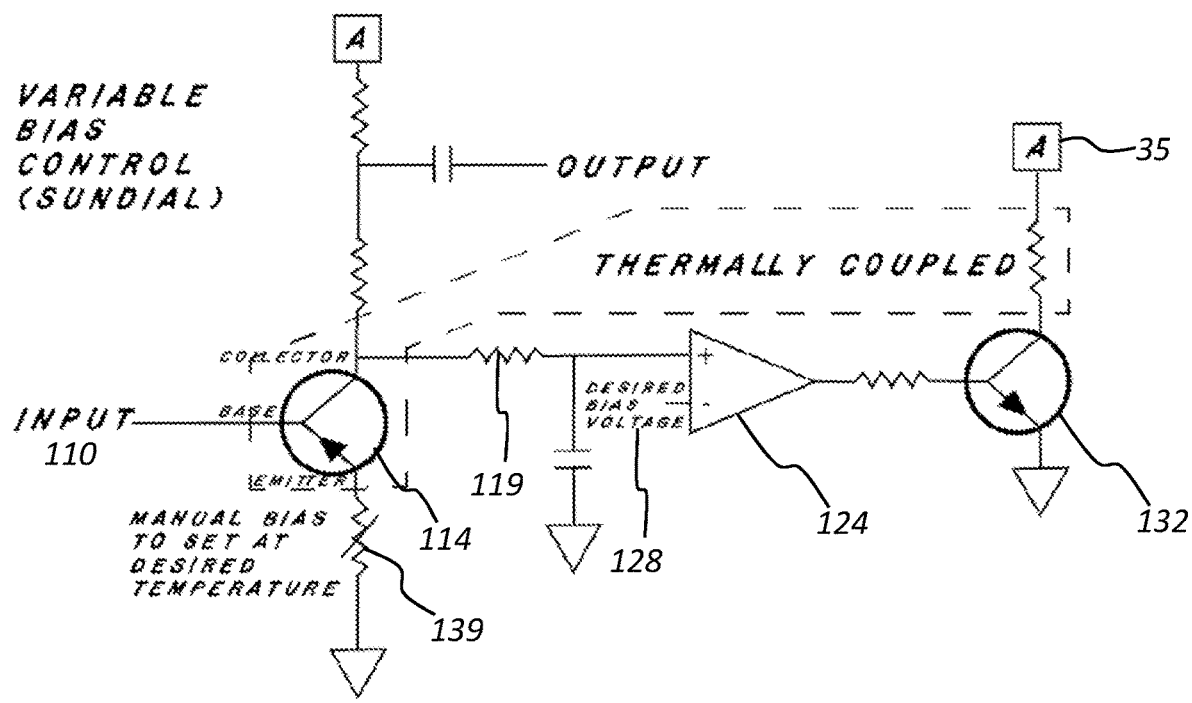
FIG. 5 shows a circuit diagram of an exemplary configuration of automatic thermal bias as disclosed herein.

With reference to FIG. 5, an exemplary embodiment of a bipolar integrated circuit that may be used for automatic thermal bias of a transistor is depicted. In some embodiments, the transistor 114 may be a bipolar junction transistor (BJT), and even more specifically, may be a germanium transistor. The circuit may be coupled to the collector of the BJT 114. FIG. 4 shows a specific topology of the BJT, and other topologies are also possible and contemplated herein. The BJT may also be NPN or PNP.

After the input 110 is passed through the BJT 114, one or more filters 119 may be provided to remove and/or reduce the AC current. In an exemplary configuration, a resistor-capacitor network 119 may be used to filter the AC current. In other configurations, a filter may not be provided.

The resulting DC current output after the resistor-capacitor network 119 may then be fed into one side of a comparing circuit, such as a comparator operational amplifier (op-amp) circuit 124. The op-amp 124 may have two inputs: one as the present DC voltage, and the other side of the op-amp circuit may be permanently or variably set using a voltage divider between supply voltage and ground. This predetermined voltage is labelled "desired bias voltage" 128 in FIG. 4. The op-amp 124 may compare the present DC voltage input from the BJT 114 (filtered through resistor-capacitor filter 119, or in other configurations, not filtered) to the desired bias voltage or predetermined voltage that may be permanently or variably set. Depending on the comparison, the op-amp 124 may have different outputs, as explained in more detail below.

The output of the op-amp 124 may be coupled to a logic gate, such as BJT logic gate 132. When the present DC voltage input into the op-amp 124 is lower than the "desired bias voltage" or predetermined voltage 128 as set at the op-amp 124, the output of the op-amp 124 brings the gate 132 high, or in other words, turns on the gate and allows current to flow. The current may flow through to one or more heating and/or cooling elements. In the exemplary configuration of FIG. 4, the current may flow through a heating circuit 135. Similarly, when the present DC voltage is higher than the "desired bias voltage" or predetermined voltage, the output of the op-amp 124 brings the gate 132 low to stop current from flowing through the heating circuit 135.

The heating circuit 135 may be thermally coupled to the BJT 114. In the exemplary configuration of FIG. 4, the heating circuit 135 is thermally coupled to the BJT 114 by direct connection to the BJT 114. For example, the thermal coupling may be achieved by placing the BJT 114 in direct contact with the heating circuit 135, and thermal grease may be used to improve heat transfer. In other configurations, the heating circuit 135 may be thermally coupled directly to the germanium transistor. When the DC bias is low, the bias sensing circuit turns the heating circuit on. The BJT 114 is thus heated until the desired bias point is reached. When that point is sensed, the heating circuit is turned off, and the BJT 114 is allowed to cool, until it falls under the optimum bias and the heating circuit is turned back on.

As shown in the exemplary configuration of FIG. 4, the circuit may comprise an additional static bias control, such as a variable resistor 139 or resistive trimmer. Variable resistor 139 may be coupled to the emitter of BJT 114. The variable resistor 139 may serve as an indirect temperature threshold control, and may be used to set the switching temperature at which the heating element is engaged. For example, it may be set internally by the manufacturer of the circuit. The level may be adjusted to set a predetermined threshold temperature and in one specific configuration, the variable resistor 139 may be adjusted to 38 degrees Celsius (100 degrees Fahrenheit). This temperature is above temperature at which any typical setting would need the circuit to operate. The variable resistor 139 may be set at other temperatures, too, keeping in mind a balance between overheating and destroying the germanium transistor, while at the same time avoiding too low a switching temperature to be effective in common use. The variable resistor typically is set at a temperature that is hotter than the circuit would ever reasonably be used at, but cooler than a temperature that would destroy the transistor, which has an upper limit of what temperature it can endure.

Figure 6:
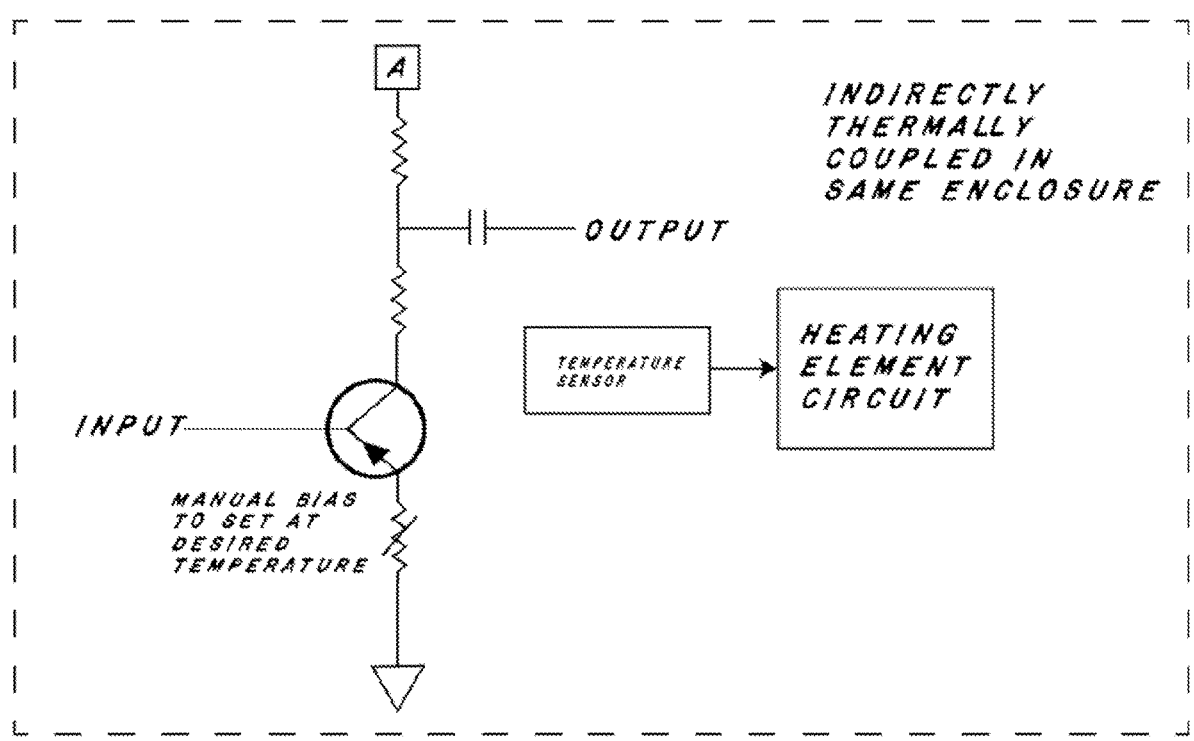
FIG. 6 shows a circuit diagram of an exemplary configuration of indirect thermal bias as disclosed herein.

A second exemplary device and method is described in FIG. 6 for indirect thermal bias. This configuration imposes thermal control within the transistor's physical enclosure using a basic thermal sensor and heating element. In this exemplary configuration, the inside of an enclosure may be warmed up to a desired temperature at which the transistor is correctly biased. The heating element and thermostat could be achieved in one component using a thermistor that heats up to a certain temperature, and then maintains that temperature. This method may not be able to account for aging and drift of the transistor nor the passive components around it. It may also require more thermal energy to heat the inside of an entire enclosure, and not just the metal or glass envelope of the transistor described in FIGS. 3 and 5.

According to one aspect, a system is described, the system for providing thermal stability to a germanium transistor comprising: a high impedance circuit coupled to a collector of the transistor for receiving an input signal; a resistor-capacitor network in electrical communication with the high impedance circuit for filtering an AC component from the input signal; a comparator operational amplifier circuit in electrical communication with the resistor-capacitor network for receiving a present DC bias from the resistor-capacitor network and comparing the present DC bias voltage to a desired bias voltage; a voltage divider electronically coupled to the comparator operational amplifier circuit, the voltage divider between supply voltage and ground for selecting the desired bias voltage; a power transistor having a gate, the gate electronically DC-coupled to an output of the comparator operational amplifier circuit, the gate having a high, open position and a low, closed position; and one or more heating elements and/or resistors thermally coupled to the germanium transistor and electrically coupled to the output of the comparator operational amplifier circuit, wherein when the present DC bias voltage is lower than the desired bias voltage, the gate is in the high, open position providing current to the one or more resistors, and wherein when the present DC bias voltage is higher than the designed bias voltage the gate is in the low, closed position. The heating element may be thermally coupled, for example, to the physical transistor case/package.

In some configurations, the system may further comprise a cooling element thermally coupled to the germanium transistor. The cooling element may be thermally coupled, for example, to the physical transistor case/package.

According to another aspect, a device is disclosed. The device may comprise: at least one of a heating source and a cooling source for thermal contact with a germanium transistor; at least one of an analog circuit and a digital circuit for controlling the at least one of a heating source and a cooling source; a voltage divider for selecting an ideal bias voltage; and the at least one of the analog and digital circuit comparing a present bias voltage to the ideal bias voltage, and controlling the at least one of a heating source and a cooling source in response to a difference between the present bias voltage and the ideal bias voltage.

The various embodiments described above, including elements of the various embodiments described above, can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

Various portions and components of apparatus within the scope of the inventions, including for example, electrical components, can be formed by one or more various suitable manufacturing processes known to those in the art. Similarly, various portions and components of apparatus within the scope of the inventions can be made from suitable materials known to those in the art. While specific electrical configurations are shown in the exemplary configurations, other equivalent electrical configurations may also be used to achieve the temperature control described herein.

The above description has set out various features, functions, methods and other aspects of the disclosure. This has been done with regard to the currently preferred embodiments thereof. Time and further development may change the manner in which the various aspects are implemented. For example, the disclosure is specifically discussed with applications to germanium transistors. However, the system may have other applications outside germanium transistors and may equally apply to other types of transistors.

The scope of protection accorded the inventions as defined by the claims is not intended to be limited to the specific electrical components, shapes, features or other aspects of the currently preferred embodiments shown and described. The claimed invention may be implemented or embodied in other forms while still being within the concepts shown, described and claimed herein. Also included are equivalents of the inventions which can be made without departing from the scope of concepts properly protected hereby.

I claim:

1. A system for providing thermal stability to a germanium transistor comprising:
   a high impedance circuit coupled to a collector of the germanium transistor for receiving an input signal;
   a resistor-capacitor network in in the high impedance circuit for filtering an AC component from the input signal;
   a comparator operational amplifier circuit in electrical communication with the resistor-capacitor network for receiving a present DC voltage from the resistor-capacitor network and comparing the present DC voltage to a desired bias voltage;
   a power transistor having a gate, the gate electronically coupled to an output of the comparator operational amplifier circuit, the gate having a high, open position and a low, closed position; and
   one or more heating elements thermally coupled to the germanium transistor and electrically coupled to the output of the comparator operational amplifier circuit, wherein when the present DC voltage is lower than the desired bias voltage, the gate is in the high, open position providing current to the one or more heating elements, and wherein when the present DC voltage is higher than the desired bias voltage the gate is in the low, closed position to stop current from the one or more heating elements.

2. The system of claim 1, further comprising a cooling element thermally coupled to the germanium transistor.

3. The system of claim 1, further comprising a variable resistor electrically coupled to an emitter of germanium transistor.

4. A device comprising:
   at least one of a heating source and a cooling source for thermal contact with a germanium transistor;
   at least one of an analog circuit and a digital circuit for controlling the at least one of a heating source and a cooling source;
   a voltage divider for selecting an ideal bias voltage; and
   the at least one of the analog and digital circuit comparing a present bias voltage to the ideal bias voltage, and controlling the at least one of a heating source and a cooling source in response to a difference between the present bias voltage and the ideal bias voltage.

5. A circuit system for providing thermal stability to a transistor comprising:
   a comparing circuit in electrical communication with the transistor for receiving a present voltage from the transistor and comparing a present voltage to a predetermined bias voltage;
   a logic gate electronically coupled to an output of the comparing circuit, the logic gate, gate having a high, open position and a low, closed position; and
   a heating element thermally coupled to the transistor and electrically coupled to the output of the comparing circuit, wherein when the present voltage is lower than the predetermined bias voltage, the gate is in the high, open position providing current to the heating element, and wherein when the present voltage is higher than the predetermine bias voltage the gate is in the low, closed position.

6. The circuit system of claim 5, wherein the comparing circuit comprises at least one of a micro controller and a comparator operational amplifier circuit.

7. The circuit system of claim 5, wherein the logic gate has a middle position between the high, open position and the low, closed position.

8. The circuit system of claim 5, further comprising a filter electrically connected to the transistor prior to the comparing circuit, the filter for filtering AC current received from the transistor.

9. The circuit system of claim 8, wherein the filter comprises a resistor-capacitor network and wherein the comparing circuit receives a present DC voltage from the resistor-capacitor network and compares the present DC voltage to a desired bias voltage.

10. The circuit of claim 7, wherein the logic gate comprises a power transistor having a gate, the gate electronically coupled to an output of the comparator operational amplifier circuit.

11. The circuit of claim 5, wherein the heating element comprises a resistor.

12. The circuit of claim 5, further comprising a cooling element thermally coupled to the transistor and electrically coupled to the output of the comparing circuit.

13. The circuit of claim 8, wherein the filter is electrically connected to a collector of the transistor.

14. The circuit of claim 5, further comprising a variable resistor electrically coupled to an emitter of the transistor.

15. The circuit of claim 5, wherein the variable resistor may be set such that the circuit for providing thermal stability does not operate above a threshold temperature.

16. A method of controlling a bipolar junction transistor, the method comprising:
   electrically coupling a collector of the bipolar junction transistor to a high impedance circuit, the high impedance circuit comprising:
      a filter for filtering AC current received from the collector of the bipolar junction transistor and outputting a present DC current;
      a comparing circuit for receiving the present DC current and determining a present DC voltage, the comparing circuit further comparing the present DC voltage to a predetermined optimal DC voltage;
      a logic gate coupled to an output of the comparing circuit, the logic gate having an open position and a closed position; and
      a logic gate electronically coupled to an output of the comparing circuit, the logic gate, gate having a first position and a second position; and
      a heating element electrically coupled to the output of the comparing circuit, wherein when the present DC voltage is lower than the predetermined optimal DC voltage, the logic gate is in a first position to turn the heating element on, and wherein when the present voltage is higher than the predetermined optimal DC voltage, the logic gate is in the second position to turn the heating element off; and
   wherein the method further comprises the step of thermally coupling the heating element to the bipolar junction transistor.

17. The method of claim 16, wherein the step of thermally coupling the heating element to the bipolar junction transistor comprises attaching the heating element to the bipolar junction transistor.

18. The method of claim 17, further comprising the step of placing thermal grease between the heating element and the bipolar junction transistor.

19. The method of claim 16, further comprising the step of electrically connecting a variable resistor to an emitter of the bipolar junction transistor.

20. The method of claim 19, further comprising the step of adjusting the variable resistor such that current does not flow through the high impedance circuit above a predetermined threshold temperature.

* * * * *